United States Patent
Biro et al.

Patent Number: 5,546,320
Date of Patent: Aug. 13, 1996

[54] METHOD FOR PERFORMING INTEGRATED SECTION-LEVEL AND FULL-CHIP TIMING VERIFICATION FOR CUSTOM MICROPROCESSOR DESIGNS

[76] Inventors: Larry L. Biro, 210 Bullard Rd., Oakham, Mass. 01068; Jengwei Pan, 6 Marylou Cir., Westboro, Mass. 01581

[21] Appl. No.: 588,161

[22] Filed: Jan. 18, 1996

Related U.S. Application Data

[63] Continuation of Ser. No. 965,213, Oct. 23, 1992, abandoned.

[51] Int. Cl.⁶ .................................................. G06F 17/50
[52] U.S. Cl. .......................................... 364/488; 364/578
[58] Field of Search .................................. 364/488, 489, 364/490, 578

[56] References Cited

U.S. PATENT DOCUMENTS

| | | | |
|---|---|---|---|
| 4,263,651 | 4/1981 | Donath et al. | 364/491 |
| 4,924,430 | 5/1990 | Zasio et al. | 364/578 |
| 4,970,664 | 11/1990 | Kaiser et al. | 364/488 |
| 5,218,551 | 6/1993 | Agrawal et al. | 364/491 |
| 5,237,514 | 8/1993 | Curtin | 364/490 |

OTHER PUBLICATIONS

"Analytical Power/Timing Optimization Technique for Digital System" by Puehli et al., IEEE 14U Design Automation Conf., 1977, pp. 142–146.

"Timing Analysis for nMOS VLSI" by N. P. Jouppi, IEEE 20th Design Automation Conf., 1983, pp. 411–418.

*Primary Examiner*—Vincent N. Trans
*Attorney, Agent, or Firm*—Mark J. Casey; Denis G. Maloney; Arthur W. Fisher

[57] ABSTRACT

A method for performing integrated section-level and full-chip timing verification is employed for integrated circuit designs that include several section designs. A plurality of bristle timing parameters define timing relationships between the section designs. A section-level verification procedure is performed for each of the section designs to determine whether the section designs conform to predetermined intra-section timing constraints. A full-chip verification procedure is performed for the integrated circuit design to determine the bristle timing parameters and to determine whether the integrated circuit design conforms with predetermined intersection timing constraints.

16 Claims, 2 Drawing Sheets

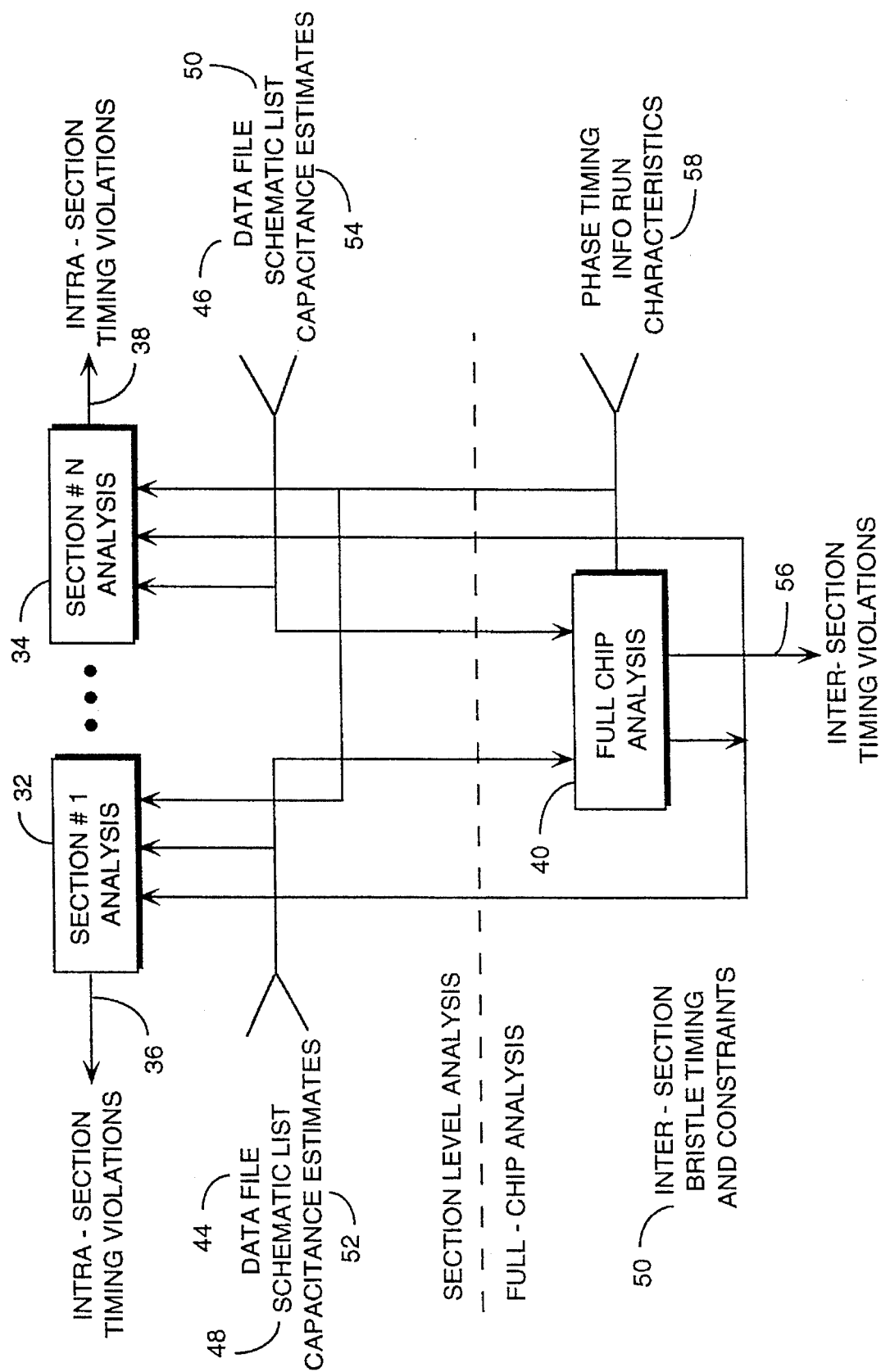

METHOD FOR PERFORMING INTEGRATED SECTION-LEVEL AND FULL-CHIP TIMING VERIFICATION FOR CUSTOM MICROPROCESSOR DESIGNS

This application is a continuation of application Ser. No. 07/965,213, filed Oct. 23, 1992 now abandoned.

FIELD OF THE INVENTION

The present invention relates to the field of evaluating integrated circuit designs for compliance with predefined timing specifications. More particularly, the invention is a method for performing integrated section-level and full-chip timing verification for custom microprocessor designs.

BACKGROUND OF THE INVENTION

Integrated circuit designs typically undergo a variety of design verification steps before the manufacturing process begins to ensure that the design meets all design goals. This evaluation process allows designers to identify design shortcomings without the cost and delay of actually building integrated circuit devices prior to performing any evaluation. This is particularly important for complex integrated circuits, such as microprocessors, because such circuits are extremely costly and time-consuming to design and fabricate.

A known method of performing full-chip verification on a logic design is to employ a timing verifier to evaluate a software model of the design and verify that the operation of the design falls within predetermined parameters based on the operation of the software model. The results of this evaluation are then compared to the desired timing specifications for the new designs so that modifications to the design, if necessary, can be made before fabrication of the chip. To perform full-chip verification in this manner, the verification procedure must evaluate the design of the circuitry connecting different functional areas (sections) of the integrated circuit together.

As will be appreciated by one of ordinary skill in the field, the complexity and cost of performing full-chip timing verification increases as the complexity of the integrated circuit design being verified increases. The time required to perform and analyze the timing characteristics on new chip designs, such as designs for microprocessors, has increased substantially in recent years. Full-chip verification for microprocessors requires long run times and large amounts of system memory to stimulate operation of the integrated circuit design. Full-chip analysis also requires analysis of large numbers of critical paths between section boundaries. In some instances, full-chip verification takes so long that cost constraints dictate reducing the number of verified parameters for each design.

On the other hand, there are significant advantages to performing full-chip analysis instead of a reduced level of verification. One such advantage is that full-chip verification provides an acceptable level of verification for high performance designs that contain many critical paths that span section boundaries. Full-chip verification also allows savings in fabrication costs if a design is found to be infeasible early in the design cycle.

One known method of reducing the time and expense of full-chip verification is to perform verification on individual sections of a complex integrated circuit design. Verification of sections takes less time than full-chip verification because each functional area of the integrated circuit obviously has fewer logic circuits than the integrated circuit as a whole. A problem with the philosophy of section-level verification is that timing failures caused by the interaction of different sections of the integrated circuit is often overlooked or inadequately evaluated, resulting in higher costs later in the design cycle. The relationships among inter-section timing parameters are known in the field as "bristle timing."

As an alternative to pure section-level verification, manual methods of integrating section-level verification with some degree of full-chip verification are known in the field. One such method is to manually maintain section-level bristle timing in verification procedures to partially and crudely analyze the interaction between different sections of the integrated circuit. This methodology has an advantage over section-level verification because it provides some degree of evaluation of the interaction between different sections of the circuit design. Nonetheless, manual maintenance of bristle timing parameters is more inefficient than section-level verification because bristle timing parameters cannot be manually maintained with precision. Multiple verification procedures with cycle time variation are not practical if bristle timing is maintained manually.

Additionally, changes in the design of one section of a microprocessor potentially result in a need to manually update bristle timing. This process is prone to error. Thus, known methods of integrating section-level and full-chip verification fall to provide the complete benefits of either section-level or full-chip verification. A method of integrating the desirable aspects of section-level verification and full-chip verification for VLSI integrated circuit devices that avoids the aforementioned problems is desirable.

SUMMARY OF THE INVENTION

The present invention is a method of performing timing analysis on VLSI integrated circuit designs. The invention performs timing verification on custom VLSI designs using a combination of section-level verification techniques integrated with full-chip verification. Section-level and full-chip timing analysis are integrated to provide the coverage and completeness of a full-chip verification procedure with the run times, efficiency, and cost-performance of section-level verification procedures. The invention is particularly useful in situations that require many iterative verification runs.

BRIEF DESCRIPTION OF THE DRAWINGS

Other advantages of the invention will become apparent upon reading the following detailed description and upon reference to the accompanying drawings, in which:

FIG. 2 is a block diagram showing the integration of full-chip and section-level timing analysis according to the present invention.

Figure 1:
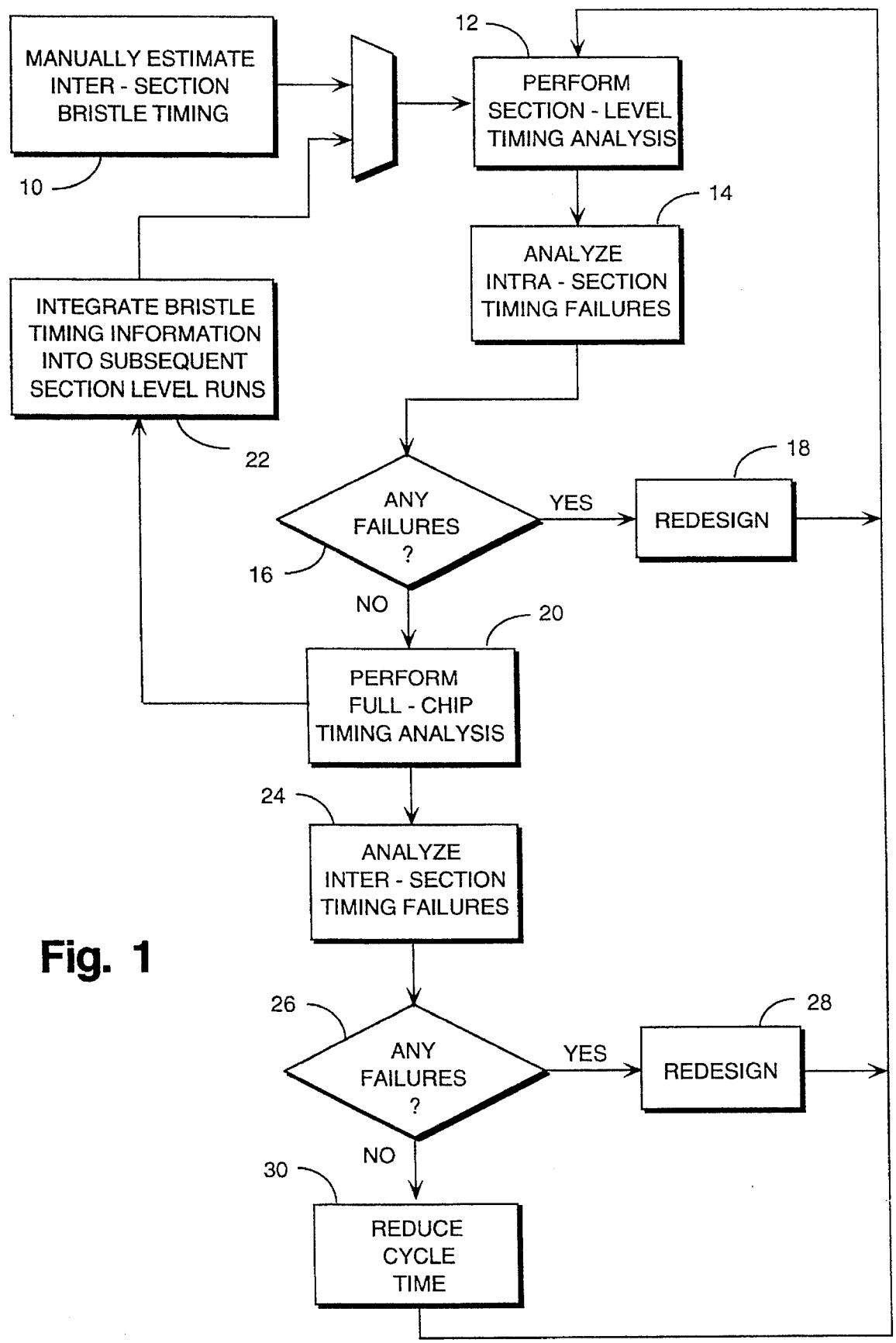
FIG. 1 is a flow chart of the verification procedure of the present invention.

While the invention is susceptible to various modifications and alternative forms, specific embodiments thereof have been shown by way of example in the drawings and will herein be described in detail. It should be understood, however, that the invention is not intended to be limited to the particular forms disclosed. On the contrary, the intention of the applicant is to cover all modifications, equivalents, and alternatives falling within the spirit and scope of the invention as defined by the appended claims.

DETAILED DESCRIPTION OF THE PREFERRED EMBODIMENTS

The present invention is a method of performing timing analysis on VLSI integrated circuit designs. A preferred embodiment of the invention is employed to perform timing analysis on microprocessors, such as the NVAX and NVAX+.

The invention provides timing verification capability on custom VLSI designs using a combination of section-level verification techniques integrated with full-chip verification. Section-level and full-chip timing analysis are integrated to provide the coverage and completeness of a full-chip verification procedure with the run times, efficiency, and cost-performance of section-level verification procedures. The invention is particularly useful in situations that require many iterative verification procedures because timing information is refined with each separate iteration. Thus, each successive iteration is performed with increasingly accurate timing information.

FIG. 1 is a flow chart of the verification procedure of the present invention. At step 10, bristle timing parameters are estimated manually prior to performing section-level verification. Alternatively, section-level verification may be performed without the bristle timing estimates if they are not available. As will be described below, the bristle timing parameters are updated for successive iterations of the section-level verification procedure after they have been obtained from the full-chip verification procedure of the present invention or developed by any other means. Individual section verification procedures are initiated at step 12.

At step 14, timing failures of individual section-level parameters are identified. Analysis of the timing aspects that interact with other sections of the integrated circuit is not performed during the section-level verification. If any failures of the predetermined timing specifications are detected at step 16, the failed section is redesigned at step 18 and the section-level verification procedure is performed on the modified section design at step 12. In this manner, timing parameters are adjusted through several iterations based on knowledge of the design of the sections being verified until all section-level verification procedures operate efficiently.

As previously noted, the method of the present invention is most effective in cases where many timing verification procedures are performed as the design is iteratively optimized for speed. The number of iterations performed for each timing verification procedure is a matter of design choice based on the speed goals of the design, and is not an essential feature of the present invention.

After section-level analysis has been performed on all sections of the integrated circuit design, full-chip analysis is performed at step 20 using a similar environment as the section verification procedures. The full-chip verification procedure initially estimates timing delays for all the section bristle timing parameters. This information is integrated into subsequent iterations of the section-level verification procedure at step 22. At step 24, inter-sectional timing failures are identified.

In a preferred embodiment of the invention, the full-chip verification procedure evaluates only those timing parameters that involve interaction between different sections. Only failures of these parameters are reported so that the quantity of timing verifier output is manageable. Thus, the full-chip analysis of the present invention only evaluates inter-section timing violations, relying on section-level verification to analyze all intra-section violations. This methodology identifies specific inter-section timing deficiencies without the detrimental aspects of conventional full-chip verification.

If any inter-sectional timing failures occur during full-chip verification (step 26), the inter-section logic that caused the failure is identified and redesigned at step 28 and the verification process of the present invention is started again at step 12. As will be appreciated by those of ordinary skill in the field, section-level analysis must be performed on those sections related to the inter-sectional failure only. Sections that did not contribute to the failure are not retested. If no inter-section timing violations are detected during full-chip analysis, cycle time of the test procedure is reduced at step 30 and the verification method of the present invention is started again at step 12. The method of the present invention may be performed as many times as desired to improve the functional performance of the design being evaluated and achieve as short a cycle time as possible.

FIG. 2 is a block diagram showing the integration of full-chip and section n-level timing analysis according to the present invention. Section-level verification procedures 32, 34 are performed for each individual section design 1 through n. As will be apparent to one of ordinary skill in the art, the number of sections in a specific integrated circuit design is variable. The specific number of sections in the design is not an essential feature of the invention. Information about the integrated circuit design being verified is shared between the section-level and full-chip verification procedures of the present invention. Intra-section timing violations 36, 38 are output for the analysis of each individual section design. After all section-level verification procedures 32, 34 have been performed, full-chip analysis 40 is performed on the design. The full-chip analysis 40 outputs inter-section timing violations 56, as previously described. The inter-section timing violations 56 are integrated into each relevant section-level verification procedure 32, 34.

FIG. 2 shows the information that is shared by the section-level verification procedures 32, 34 and the full-chip verification procedure 40. Data files 44, 46 that contain false path information and network modification commands, as well as other related data are generated and/or used by both section-level and full-chip runs. Schematic wire lists 48, 50 and capacitance estimates 52, 54 are also used by both section-level and full-chip verification procedures. The data files 44, 46, schematic wire lists 48, 50 and capacitance estimates 52, 54 each contain information needed to simulate the operation of the specific integrated circuit design being verified. Determining the content of these files and creating the files are within the ability of those of ordinary skill in the field.

Other information, such as phase timing information, signal RC delay estimates or other run characteristics 58 of the design may be shared among the section-level verification procedures, if available. If applicable, this information may be shared with the full-chip verification procedure 40.

To support the present invention, a conventional timing verifier must be modified to detect all inter-section bristles and share the timing estimates of these bristles automatically in subsequent section-level runs. This provides the timing stimulus and constraints necessary to perform section-level simulations with full-chip estimated bristle timing. The specific details of how this sharing of information is accomplished are not essential to the present invention. Moreover, these modifications to conventional timing verifiers are within the ability of those of ordinary skill in the art.

A timing verifier of the present invention must also provide indirect data file capability to allow the full-chip and section simulations to be integrated effectively. This allows the full-chip verification procedure to efficiently utilize the work performed during the section-level verification procedure. Another important aspect of the present invention is the automatic merging of section bristle timing information into full-chip internal nodes. Nodes that are treated as bristles at the section level must be efficiently merged into internal nodes at the full-chip level. This function must be performed automatically. Creating indirect file capability and automatically merging bristle timing information is within the ability of those of ordinary skill in the field based on the description of the invention contained herein.

Finally, a timing verifier operating according to the method of the present invention must provide path reporting :filtered at the full-chip level so that only failures involving paths that cross at least two different section boundaries on the integrated circuit design being verified are reported. This filtering is necessary to insure the quantity of output data to be analyzed is reasonable. The development of filtering is within the ability of those of ordinary skill in the field.

An important feature of the present invention is that it provides the advantages of section-level verification procedures, such as short run times, interactive capability, localized analysis, along with more accurate and thorough analysis allowed by conventional full-chip verification procedures. The method of the present invention is most advantageous in cases where many timing-verification procedures are required as the design is iteratively optimized for speed. This is particularly true of complex microprocessor designs, where each section is analyzed using the present invention an average of 20 times before results are finalized.

A preferred embodiment of the present invention has been implemented on a VAX 6500 system. Iterative testing on such a system results in a total of 100 section verification procedures at 15 CPU minutes per verification procedure. Full-chip analysis of some microprocessor designs have been performed approximately 10–15 times at 2.5 CPU hours per verification procedure. Total CPU time for all timing analysis has been approximately 75–100 CPU hours. In comparison, the same level of full-chip verification using prior art methodologies would take approximately 300–400 CPU hours. Thus, the present invention is considerably more efficient than full-chip verification methods known in the prior art.

Thus, there has been described herein a method for performing section-level full-chip timing verification on microprocessors. It will be understood that various changes in the details, arrangements and configurations of the parts and system which have been described and illustrated above in order to explain the nature of the present invention may be made by those skilled in the art within the principle and scope of the present invention as expressed in the appended claims.

What is claimed is:

1. A computerized method for performing fully integrated section-level and full-chip timing verification for an integrated circuit design having a plurality of section designs, the sum of all of said section designs constituting said integrated circuit, said method determining whether the performance of each of said plurality of section designs conforms with predetermined intra-section timing constraints, and determining whether the performance of said integrated circuit design conforms with a plurality of predetermined inter-section timing constraints, said method comprising the steps of:

A) a computer system performing a section-level timing verification procedure for each of said plurality of section designs of said integrated circuit design to determine whether each of said section designs individually conforms with said predetermined intra-section timing constraints;

B) modifying any said section design that does not conform with said predetermined intra-section timing constraints, and repeating steps (A) and (B) with respect to each said modified section design until each said modified section design conforms with said predetermined intra-section timing constraints;

C) after step (D), said computer system performing a full-chip verification procedure for said integrated circuit design to determine only whether said integrated circuit design including any said modified section design conforms with said predetermined inter-section timing constraints, whereby said section-level verification procedure and said full-chip verification procedure are performed in separate steps;

(D) if said integrated circuit design does not conform with said predetermined inter-section timing constraints, modifying said integrated circuit design, and repeating steps (A) through (D).

2. The method of claim 1 wherein said method further comprises the step of iteratively performing said section-level timing verification procedure for each of said plurality of section designs and said full-chip verification procedure for said integrated circuit design.

3. The method of claim 1 wherein said method further comprises the steps of:

reducing a cycle time of either said section-level timing verification procedure or said full-chip verification procedure; and performing at least one additional iteration of said section-level timing verification procedure or said full-chip verification procedure.

4. The method of claim 1, wherein each said section design is characterized by timing parameters, and step (C) includes the step of evaluating timing parameters that involve interaction between different ones of said section designs of said integrated circuit design.

5. The method of claim 1, wherein each said section design is characterized by timing parameters, and said method further comprising the step of evaluating timing parameters that involve interaction between different ones of said section designs of said integrated circuit designs, said evaluating step consisting of step (C).

6. The method of claim 1, wherein each said section design is characterized by timing parameters, and said step (C), and not step (A), includes the step of evaluating timing parameters that involve interaction between different ones of said section designs of said integrated circuit design.

7. The method of claim 1, wherein said section designs have a plurality of boundaries, and said integrated circuit design includes a plurality of paths including intersection paths that cross at least two section boundaries, and said method further comprises the step of reporting any failure of said integrated circuit design to conform with said predetermined intersection timing constraints, and filtering said reports so that only any of said failures involving said intersection paths are reported in a filtered report.

8. The method of claim 7, wherein said step (D) consists of the step of modifying said integrated circuit design responsive to said filtered report and only with respect to the section designs having boundaries crossed by the intersection paths, if any, involved in said failures.

9. A method for performing integrated section-level timing and full-chip timing verification for an integrated circuit design having a plurality of section designs and a plurality of bristle timing parameters that define timing relationships between said sections to determine whether the performance of each of said plurality of section designs conforms with predetermined intra-section timing constraints and to determine whether the performance of said integrated circuit design conforms to a plurality of predetermined inter-section timing constraints, said method comprising the steps of:

performing a section-level timing verification procedure for each of said plurality of section designs of said integrated circuit design to determine whether each of said section designs conforms with said predetermined intra-section timing constraints;

performing a full-chip timing verification procedure for said integrated circuit design to determine said bristle timing parameters and to determine whether said integrated circuit design conforms with said predetermined inter-section timing constraints.

10. The method of claim 9 wherein said method further comprises the step of iteratively performing said section-level timing verification procedure for each of said section designs and said full-chip timing verification procedure for said integrated circuit design.

11. The method of claim 10 wherein said method further comprises the step of replacing said estimates of said bristle timing parameters with said bristle timing parameters determined by performing full-chip timing verification for successive iterations of said section-level timing verification procedures.

12. The method of claim 9 wherein said method further comprises the steps of:

integrating said bristle timing parameters determined by performing full-chip verification into said section-level timing verification; and performing a successive iteration of said section-level timing verification with said bristle timing parameters determined by performing full-chip timing verification.

13. The method of claim 9 wherein said method further comprises the step of employing estimates of said bristle timing parameters in each of said section-level timing verification procedures.

14. The method of claim 9 wherein said method further comprises the steps of:

reducing a cycle time of either said section-level timing verification procedure or said full-chip timing verification procedure; and performing at least one additional iteration of said section-level timing verification procedure or said full-chip timing verification procedure.

15. A method for performing integrated section-level timing and full-chip timing verification for an integrated circuit design having a plurality of section designs and a plurality of bristle timing parameters that define timing relationships between said sections to determine whether the performance of each of said plurality of section designs conforms with predetermined intra-section timing constraints and to determine whether the performance of said integrated circuit design conforms to a plurality of predetermined inter-section timing constraints, said method comprising the steps of:

(A) performing a section-level timing verification procedure for one of said plurality of section designs to determine whether said one of said section designs conforms with said predetermined intra-section timing constraints;

(B) if said verification fails to conform with said predetermined intra-section timing constraints, redesigning said one of said section designs and repeat step A;

(C) repeat step B until said section designs conforms with said predetermined intra-section timing constraints;

(D) repeating steps A, B and C for each remaining section design;

(E) performing a full-chip timing verification procedure for said integrated circuit design to determine said bristle timing parameters and to determine whether said integrated circuit design conforms with said predetermined inter-section timing constraints;

(F) identifying which of said plurality of section designs contributed to said failure of said inter-section timing constraints if a failure of said inter-section timing constraints occurs;

(G) if said integrated circuit design fails to meet said predetermined inter-section timing constraints, redesigning the identified section designs of said integrated circuit design that contributed to said failure;

(H) integrating said bristle timing parameters determined by said full-chip timing verification procedure into said section-level test procedure;

(I) repeating steps D, E, F, G and H until said integrated circuit design conforms to said predetermined inter-section timing constraints.

16. The method of claim 15 wherein said method further comprises the steps of:

reducing a cycle time of either said section-level timing verification procedure or said full-chip timing verification procedure; and performing at least one additional iteration of said section-level timing verification procedure or said full-chip timing verification procedure.

* * * * *